US010746959B2

(12) United States Patent
Wassink

(10) Patent No.: US 10,746,959 B2
(45) Date of Patent: Aug. 18, 2020

(54) FANLESS COOLING SYSTEM FOR FULL DISPLAY MIRROR

(71) Applicant: Gentex Corporation, Zeeland, MI (US)

(72) Inventor: Kurtis J. Wassink, Holland, MI (US)

(73) Assignee: GENTEX CORPORATION, Zeeland, MI (US)

(*) Notice: Subject to any disclaimer, the term of this patent is extended or adjusted under 35 U.S.C. 154(b) by 77 days.

(21) Appl. No.: 15/904,575

(22) Filed: Feb. 26, 2018

(65) Prior Publication Data
US 2018/0246294 A1 Aug. 30, 2018

Related U.S. Application Data

(60) Provisional application No. 62/464,203, filed on Feb. 27, 2017.

(51) Int. Cl.
G02B 7/195 (2006.01)
G02B 7/18 (2006.01)
G02F 1/29 (2006.01)
H05K 7/20 (2006.01)
(Continued)

(52) U.S. Cl.
CPC ............ *G02B 7/1815* (2013.01); *B60R 1/04* (2013.01); *B60R 1/12* (2013.01); *G02F 1/29* (2013.01); *H05K 7/20272* (2013.01); *H05K 7/20963* (2013.01); *H05K 7/20981* (2013.01); *B60R 2001/1215* (2013.01); *B60R 2001/1223* (2013.01); *B60R 2001/1253* (2013.01)

(58) Field of Classification Search
CPC ..... B60R 1/04; B60R 1/12; B60R 2001/1215; B60R 2001/1223; B60R 2001/1253; G02B 7/1815; G02B 7/18; G02B 7/181; G02B 7/195; G02F 1/29; H05K 7/20272; H05K 7/20963; H05K 7/20981; H05K 7/20

See application file for complete search history.

(56) References Cited

U.S. PATENT DOCUMENTS 3,781,094 A * 12/1973 Griest ................. G02B 7/1815
359/845
3,909,118 A * 9/1975 Schmidt ................. G02B 5/08
359/845
(Continued)

Primary Examiner — William R Alexander
Assistant Examiner — Balram T Parbadia
(74) Attorney, Agent, or Firm — Price Heneveld LLP; Bradley D. Johnson

(57) ABSTRACT

A display mirror assembly for a vehicle includes a housing. An electro-optic element may be operably coupled with the housing. A circuit board may be adjacent the electro-optic element. An electrostatic fluid accelerator may be adjacent the circuit board and may be configured to move ions within the housing. An actuator device may be disposed on the housing and may be operably coupled with the electro-optic element. The actuator device may be adjustable to tilt the electro-optic element in one direction, thereby moving the electro-optic element to an off-axis position which approximately simultaneously changes an activation state of a display module. The actuator device may be also adjustable to tilt the electro-optic element in another direction, thereby moving the electro-optic element to an on-axis position which approximately simultaneously changes the activation state of the display module.

9 Claims, 4 Drawing Sheets

(51) Int. Cl.
*B60R 1/04* (2006.01)
*B60R 1/12* (2006.01)

(56) References Cited

U.S. PATENT DOCUMENTS

| | | | | | |
|---|---|---|---|---|---|
| 4,167,310 | A * | 9/1979 | Persha | ............... | G03B 21/11 353/52 |
| 4,320,937 | A * | 3/1982 | Schuwerk | ............ | B60R 1/0602 359/508 |
| 4,415,234 | A * | 11/1983 | Meyers | ................ | F28D 20/02 359/848 |
| 4,431,269 | A * | 2/1984 | Barnes, Jr. | ........... | G02B 7/1815 359/845 |
| 4,764,003 | A * | 8/1988 | Lake | ..................... | G02B 1/00 359/846 |
| 5,638,895 | A * | 6/1997 | Dodson | ............... | H01L 23/467 165/121 |
| 5,719,714 | A * | 2/1998 | Ackeret | ................ | B60R 1/12 359/871 |
| 6,201,471 | B1 * | 3/2001 | Jones | ................. | B60H 1/00985 340/461 |
| 6,919,698 | B2 * | 7/2005 | Krichtafovitch | ........ | B03C 3/68 315/506 |
| 7,397,461 | B1 * | 7/2008 | Graham | ................. | G06F 1/20 345/156 |
| 7,740,362 | B1 * | 6/2010 | Neil | ........................ | G02B 5/08 359/845 |
| 2004/0253130 | A1 * | 12/2004 | Sauciuc | ................ | F04D 33/00 417/436 |
| 2009/0201137 | A1 * | 8/2009 | Weller | ..................... | B60R 1/10 340/425.5 |
| 2010/0080399 | A1 * | 4/2010 | Pfau | ....................... | B60N 2/56 381/71.4 |
| 2010/0139306 | A1 * | 6/2010 | Krenik | ................... | F25B 9/004 62/402 |
| 2011/0292560 | A1 * | 12/2011 | Jewell-Larsen | ......... | G06F 1/203 361/231 |
| 2012/0261703 | A1 * | 10/2012 | Zimmerman | ......... | H01L 33/641 257/98 |
| 2014/0017075 | A1 * | 1/2014 | Wu | ........................ | F04D 29/626 415/203 |
| 2015/0116939 | A1 * | 4/2015 | Bernstein | ........... | H05K 7/20281 361/699 |
| 2016/0001706 | A1 * | 1/2016 | Fish, Jr. | ............ | G02B 27/0149 359/275 |
| 2016/0079840 | A1 * | 3/2016 | Tsoi | ....................... | H02K 44/02 417/53 |

* cited by examiner

FANLESS COOLING SYSTEM FOR FULL DISPLAY MIRROR

FIELD OF THE DISCLOSURE

The present disclosure generally relates to a display mirror, and more particularly to a fanless cooling system for a full display mirror.

SUMMARY OF THE DISCLOSURE

According to some embodiments of the present disclosure, a display mirror assembly may comprise a housing; an electro-optic element disposed within the housing; a printed circuit board in communication with the electro-optic element; and an electrostatic fluid accelerator disposed within the housing.

In some embodiments, the electrostatic fluid accelerator may be disposed on or adjacent to the printed circuit board. In some embodiments, the printed circuit board may be disposed adjacent to the electro-optic element. The electrostatic fluid accelerator may comprise a corona electrode and a collector electrode; the corona electrode may be in a spaced relationship with the collector electrode. In some embodiments, the display mirror assembly may further comprise a heat sink disposed within the housing; the corona electrode may be disposed adjacent the heat sink. In some embodiments, the corona electrode may be disposed on the printed circuit board. In some embodiments, the display mirror may further comprise a rear shield; the printed circuit board may be disposed within the rear shield; the corona electrode may be disposed on the rear shield. In some embodiments, the display mirror may comprise a heat sink disposed within the housing; and may further comprising a rear shield; the printed circuit board may be disposed within the rear shield; the collector electrode may be disposed on one of the heat sink, the rear shield, and the printed circuit board; and the collector electrode may be in a spaced relationship with the corona electrode. In some embodiments, the display mirror assembly may further comprise a display module disposed within the housing behind the electro-optic element, a heat sink and an optic block disposed between the printed circuit board and the display module. In some embodiments, the electrostatic fluid accelerator may be configured to move ions within the housing.

In some embodiments, a display mirror assembly for a vehicle may comprise a housing; an electro-optic element operably coupled with the housing; a circuit board adjacent the electro-optic element; an electrostatic fluid accelerator adjacent the circuit board and configured to move ions within the housing; and an actuator device disposed on the housing and operably coupled with the electro-optic element, wherein the actuator device may be adjustable to tilt the electro-optic element in one direction, thereby moving the electro-optic element to an off-axis position which approximately simultaneously changes an activation state of a display module, and wherein the actuator device may also be adjustable to tilt the electro-optic element in another direction, thereby moving the electro-optic element to an on-axis position which approximately simultaneously changes the activation state of the display module.

These and other features, advantages, and objects of the present disclosure will be further understood and appreciated by those skilled in the art by reference to the following specification, claims, and appended drawings.

DETAILED DESCRIPTION

Figure 1:
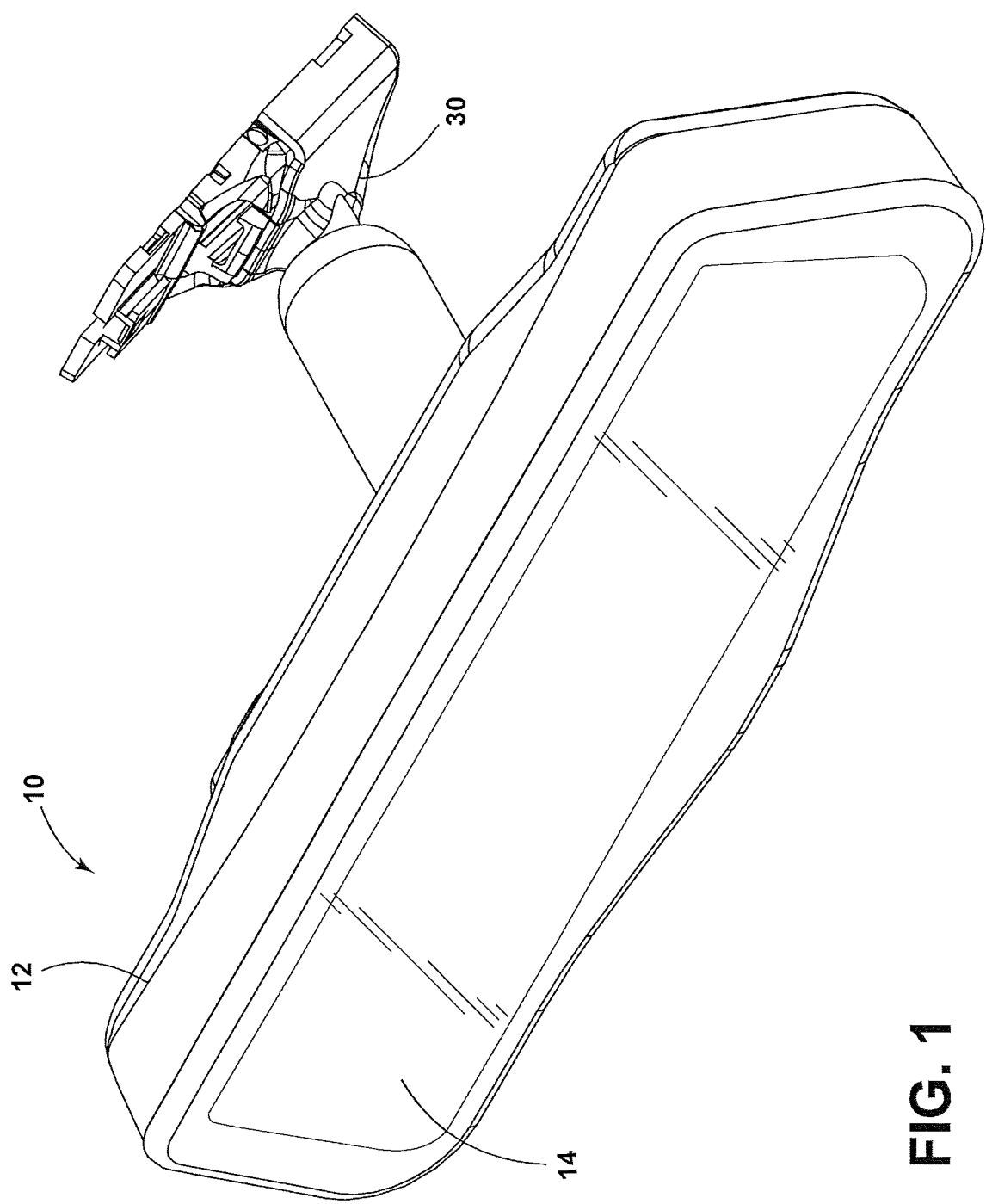
FIG. 1 is a top front perspective view of a display mirror assembly of the present disclosure for a vehicle.

The present illustrated embodiments reside primarily in combinations of method steps and apparatus components related to a display mirror assembly. Accordingly, the apparatus components and method steps have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, like numerals in the description and drawings represent like elements.

For purposes of description herein, the terms "upper," "lower," "right," "left," "rear," "front," "vertical," "horizontal," and derivatives thereof, shall relate to the disclosure as oriented in FIG. 1. Unless stated otherwise, the term "front" shall refer to the surface of the device closer to an intended viewer of the device, and the term "rear" shall refer to the surface of the device further from the intended viewer of the device. However, it is to be understood that the disclosure may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The terms "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises a . . . " does not, without more constraints, preclude the existence of additional identical elements in the process, method, article, or apparatus that comprises the element.

Referring to FIGS. 1-4, reference numeral 10 generally designates a display mirror assembly for a vehicle includes a housing 12. An electro-optic element 14 is operably coupled with the housing 12. A circuit board 16 is adjacent the electro-optic element 14. An electrostatic fluid accelerator 18 is adjacent the circuit board 16 and is configured to move ions within the housing 12. An actuator device 20 is disposed on the housing 12 and is operably coupled with the electro-optic element 14. The actuator device 20 is adjustable to tilt the electro-optic element 14 in one direction, thereby moving the electro-optic element 14 to an off-axis position which approximately simultaneously changes an activation state of a display module 22 within the housing 12. The actuator device 20 is also adjustable to tilt the electro-optic element 14 in another direction, thereby moving the electro-optic element 14 to an on-axis position which approximately simultaneously changes the activation state of the display module 22.

With reference again to FIGS. 1 and 2, the illustrated display mirror assembly 10 includes a mount 30 configured for coupling to an inside surface 32 of a windscreen 34 of a vehicle. The mount 30 may be a single ball mount or a two ball mount, depending on the desired application. It will be understood that the electro-optic element 14 may be operably coupled with an inside surface of the housing 12. Alternatively, the housing 12 may interface directly with a periphery or a back side of the electro-optic element 14, or may be secured to the electro-optic element 14 via a bezel. Regardless, the housing 12 provides a generally sealed construction that protects the interior components of the display mirror assembly 10, while allowing clear visible access to the electro-optic element 14 and the display module 22 disposed behind the electro-optic element 14.

Figure 2:
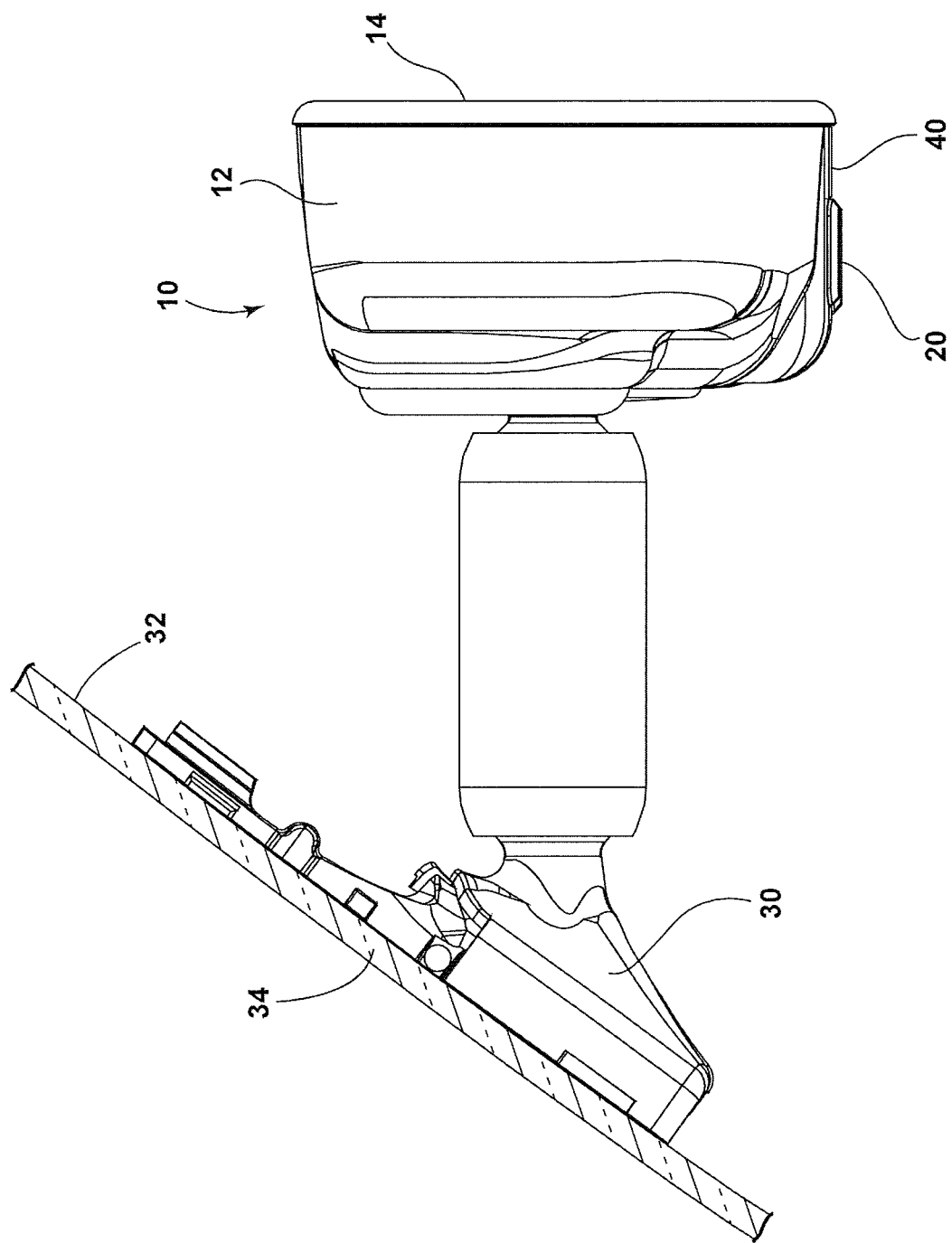
FIG. 2 is a side elevational view of the display mirror assembly of FIG. 1.

As illustrated in FIG. 2, the actuator device 20 is disposed on a bottom side of the housing 12 and is generally configured to move the electro-optic element 14 (and possibly the housing 12) between an off-axis position and on-axis position. In one instance, the on-axis position provides a reflected view of a rearward area of a vehicle to a driver of the vehicle. When the electro-optic element 14 is moved to an off-axis position (whether the electro-optic element 14 moves independently or with the housing 12), the electro-optic element 14 is adjusted in a direction slightly away from the driver. Upon movement of the electro-optic element 14, the display module 22 is activated, thereby providing a display on the display module 22 of a rearward view of the vehicle as captured by an imager disposed on the vehicle.

Figure 3:
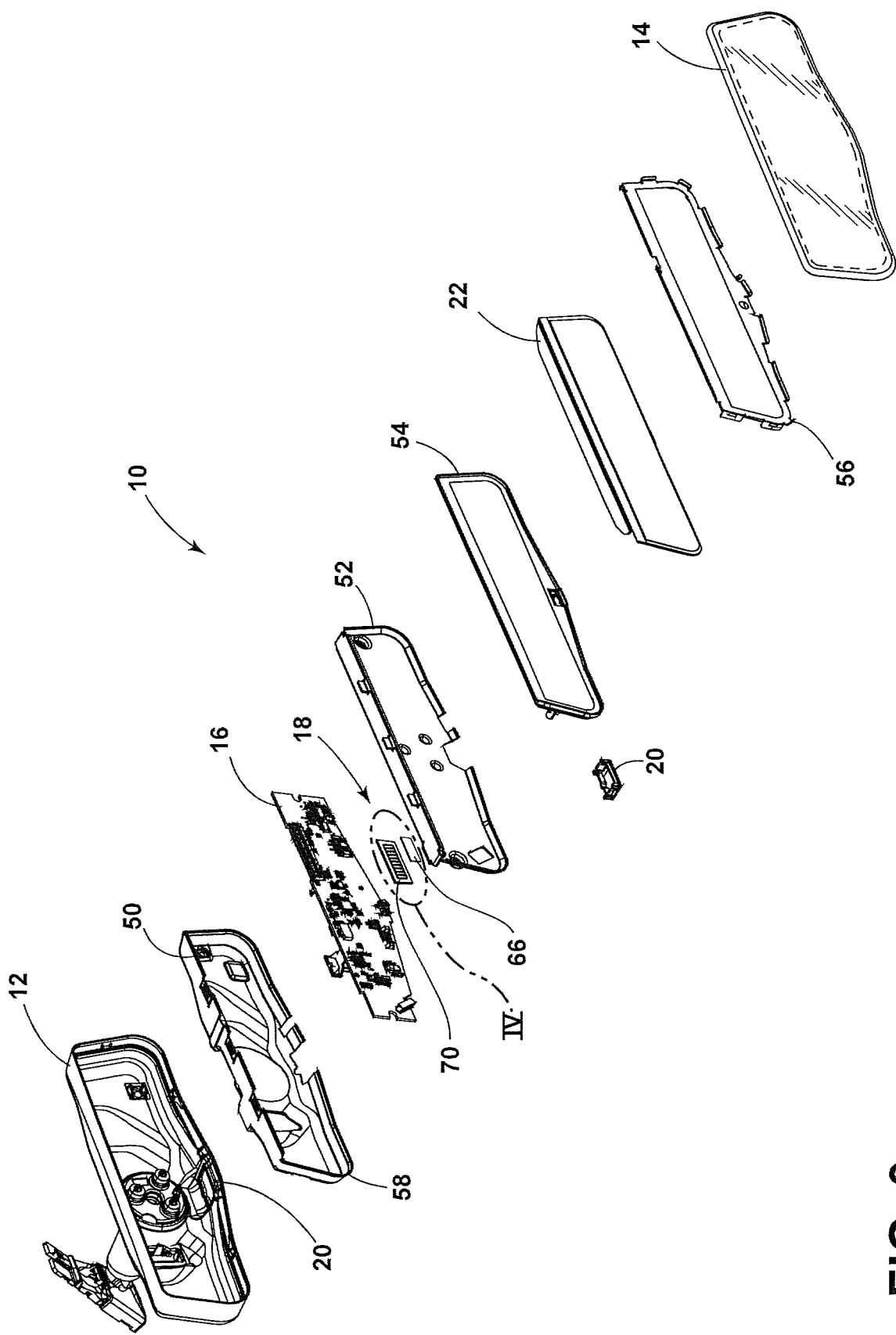
FIG. 3 is an exploded top perspective view of a display mirror assembly of the present disclosure.

With reference now to FIG. 3, the display mirror assembly 10 generally includes a rear shield 50 configured to capture the electro-optic element 14 and other electrical components disposed behind electro-optic element 14. The rear shield 50 is configured for fitted engagement with the housing 12. The circuit board 16 is disposed within the rear shield 50 and may include the electrostatic fluid accelerator 18, which moves air in and around the circuit board 16, as set forth in more detail herein. A heat sink 52 and an optic block 54 are disposed between the circuit board 16 and the display module 22. In the illustration set forth in FIG. 3, the optic block 54 is configured to be received within the heat sink 52. A front shield 56, which may also act as a carrier plate, is disposed in front of the display module 22 and is configured to engage a forward portion 58 of the rear shield 50 and may also engage the electro-optic element 14.

Figure 4:
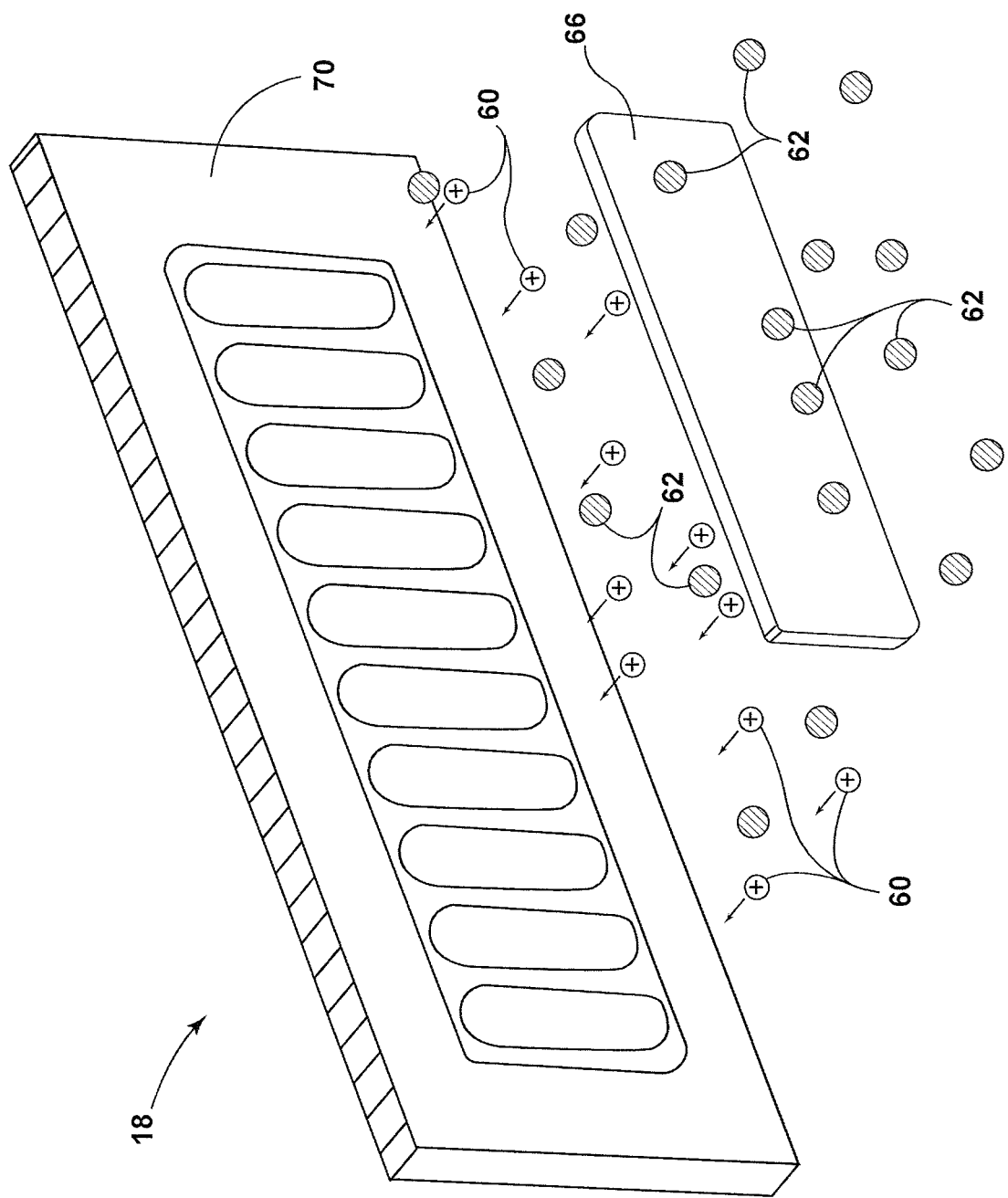
FIG. 4 is a top perspective view of an electrostatic fluid accelerator for use in a housing of a display mirror assembly of the present disclosure.

With reference again to FIG. 3 and with reference to FIG. 4, the electrostatic fluid accelerator 18 is configured to pump a fluid (such as air) without any moving parts. Stated differently, the electrostatic fluid accelerator 18 is configured to move air within the housing 12 of the display mirror assembly 10 without using conventional fans or fan blades. Rather, the electrostatic fluid accelerator 18 uses an electric field that propels charged air molecules a predetermined distance across the electrostatic fluid accelerator 18. Air in and around the electrostatic fluid accelerator 18 is normally neutrally charged. The electrostatic fluid accelerator 18 charges molecules in the air to create ions 60. Once the air molecules have been ionized, the ions 60, in addition to neutral molecules 62 in and around the ions 60, can be moved in a pre-desired direction (direction of the arrows of the ions 60) over a predetermined distance from a corona electrode 66 to a collector electrode 70. The ions 60 are then recaptured by the electrostatic fluid accelerator 18 and neutralized to eliminate any net charge leaving the system. In FIG. 3, the corona electrode 66 is positioned adjacent the heat sink 52 and the collector electrode 70 is positioned adjacent the corona electrode 66. However, it will be understood that the corona electrode 66 can be positioned on the circuit board 16, the rear shield 50, the heat sink 52, etc. Likewise, the collector electrode 70 can be positioned on the circuit board 16, the rear shield 50, the heat sink 52, etc. in spaced relation to the corona electrode 66. Fluid (air) between the corona electrode 66 and the collector electrode 70 will move, thereby having a cooling effect on the electrical components, such as the circuit board 16.

It is generally anticipated that the electrostatic fluid accelerator 18 may be utilized at normal levels of humidity and normal temperatures that are typically observed during the use of interior mirror assemblies. The electrostatic fluid accelerator 18 does not produce significant heat or light radiation. In addition, the electrostatic fluid accelerator 18 uses minimal electricity, making movement of air through the housing 12 an efficient manner of keeping the circuit board 16 and other components within the display mirror assembly 10 cool. A minimal amount of the ions 60 are generally created using the electrostatic fluid accelerator 18. The ions 60 have a net charge and are generally repelled from the corona electrode 66 having the same charge and attracted to the collector electrode 70, which includes an opposite charge. Between the two electrodes 66, 70, the neutral air molecules 62 are attracted to neither electrode 66, 70 and are generally unaffected by the ionization process. However, for the ions 60 to reach the collector electrode 70, the ions 60 must move through the mass of the neutral molecules 62. This process results in the ions 60 pushing the neutral air molecules 62 along with the ions 60, which is generally referred to as thrust. As the ions 60 reach the collector electrode 70, most of the ions 60 lose charge (the ions 60 gain an electron from the collector electrode 70). Some of the ions 60 that do not collide with the collector electrode 70 may be drawn back up to the collector electrode 70. Thus, an alternating driving voltage of the proper frequency can be beneficial. It will be understood that air temperature, air flow, distance of ion travel, electrode shape, humidity, etc. can affect the exact amount of energy required to cool the circuit board 16 to a predetermined temperature, or to maintain the circuit board 16 at a predetermined temperature.

It will be understood by one having ordinary skill in the art that construction of the described disclosure and other components is not limited to any specific material. Other exemplary embodiments of the disclosure disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and further it is to be understood that such concepts are intended to be covered by the following claims unless these claims by their language expressly state otherwise.

What is claimed is:

1. A display mirror assembly comprising:
    a housing;
    an electro-optic element disposed within the housing;
    a rear shield;
    a printed circuit board disposed within the rear shield and in communication with the electro-optic element; and
    an electrostatic fluid accelerator disposed within the housing, the electrostatic fluid accelerator comprising a corona electrode and a collector electrode, wherein the corona electrode is in a spaced apart relationship with and generally parallel to the collector electrode and wherein the corona electrode is directly disposed on the rear shield.

2. The display mirror assembly of claim 1, wherein the electrostatic fluid accelerator is disposed on or adjacent to the printed circuit board.

3. The display mirror assembly of claim 2, wherein the printed circuit board is disposed adjacent to the electro-optic element.

4. The display mirror assembly of claim 1, further comprising a heat sink disposed within the housing; wherein the corona electrode is disposed adjacent the heat sink.

5. The display mirror assembly of claim 1, wherein the corona electrode is disposed on the printed circuit board.

6. The display mirror of claim 1, further comprising a heat sink disposed within the housing; further comprising a rear shield; wherein the printed circuit board is disposed within the rear shield; wherein the collector electrode is disposed on one of the heat sink, the rear shield, and the printed circuit board; and wherein the collector electrode is in a spaced relationship with the corona electrode.

7. The display mirror assembly of claim 1, further comprising a display module disposed within the housing behind the electro-optic element, a heat sink and an optic block disposed between the printed circuit board and the display module.

8. The display mirror assembly of claim 1, wherein the electrostatic fluid accelerator is configured to move ions within the housing.

9. A display mirror assembly for a vehicle, comprising:
    a housing;
    an electro-optic element operably coupled with the housing;
    a rear shield;
    a circuit board disposed within the rear shield and adjacent the electro-optic element;
    an electrostatic fluid accelerator adjacent the circuit board and configured to move ions within the housing, the electrostatic fluid accelerator comprising a corona electrode and a collector electrode, wherein the corona electrode is in a spaced apart relationship with and generally parallel to the collector electrode and is directly disposed on the rear shield; and
    an actuator device disposed on the housing and operably coupled with the electro-optic element, wherein the actuator device is adjustable to tilt the electro-optic element in one direction, thereby moving the electro-optic element to an off-axis position which approximately simultaneously changes an activation state of a display module, and wherein the actuator device is also adjustable to tilt the electro-optic element in another direction, thereby moving the electro-optic element to an on-axis position which approximately simultaneously changes the activation state of the display module.

* * * * *